United States Patent
Owczarz et al.

(10) Patent No.: US 6,676,493 B1
(45) Date of Patent: Jan. 13, 2004

(54) INTEGRATED PLANARIZATION AND CLEAN WAFER PROCESSING SYSTEM

(75) Inventors: Aleksandar Owczarz, San Jose, CA (US); Yehiel Gotkis, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 64 days.

(21) Appl. No.: 10/033,615

(22) Filed: Dec. 26, 2001

(51) Int. Cl.[7] .................................................. B24B 1/00
(52) U.S. Cl. ................. 451/67; 451/5; 451/41; 451/56; 451/66; 451/285; 451/286; 451/287; 451/288; 451/289; 451/333; 451/443; 451/444; 15/77; 15/88.2; 15/88.3; 15/102
(58) Field of Search .......................... 451/5, 41, 56, 451/66, 67, 285, 286, 287, 288, 289, 333, 443, 444; 15/77, 88.2, 88.3, 102

(56) References Cited

U.S. PATENT DOCUMENTS

| | | | |
|---|---|---|---|
| 5,271,774 A | 12/1993 | Leenaars et al. | |
| 5,672,239 A | 9/1997 | DeOrnellas | |
| 5,778,554 A | 7/1998 | Jones | |
| 5,875,507 A | 3/1999 | Stephens et al. | |
| 6,187,684 B1 | 2/2001 | Farber et al. | |
| 6,380,086 B1 | * 4/2002 | Robinson et al. | ........... 438/692 |
| 6,405,399 B1 | * 6/2002 | Farber et al. | .................. 15/77 |
| 6,450,860 B1 | * 9/2002 | Halley | ........................... 451/5 |
| 6,457,199 B1 | * 10/2002 | Frost et al. | ................... 15/77 |
| 6,468,362 B1 | * 10/2002 | Chen et al. | ................... 134/26 |

OTHER PUBLICATIONS

U.S. Ser. No. 09/493,978, filed Jan. 28, 2000, entitled "System and Method for Controlled Polishing and Planarization of Semiconductor Wafers,".

* cited by examiner

Primary Examiner—Joseph J. Hail, III
Assistant Examiner—Shantese McDonald
(74) Attorney, Agent, or Firm—Martine & Penilla, LLP

(57) ABSTRACT

A wafer processing module is provided. In one example, the wafer processing module includes a sub-aperture CMP processing system and a pad exchange system including a pad magazine for storing CMP processing pads and a pad exchange robot for transferring CMP processing pads between the sub-aperture CMP processing system and the pad magazine. The wafer processing module includes a module frame that integrates the sub-aperture CMP processing system including the pad exchange system, with a wafer scrubber unit and a wafer SRD unit.

22 Claims, 11 Drawing Sheets

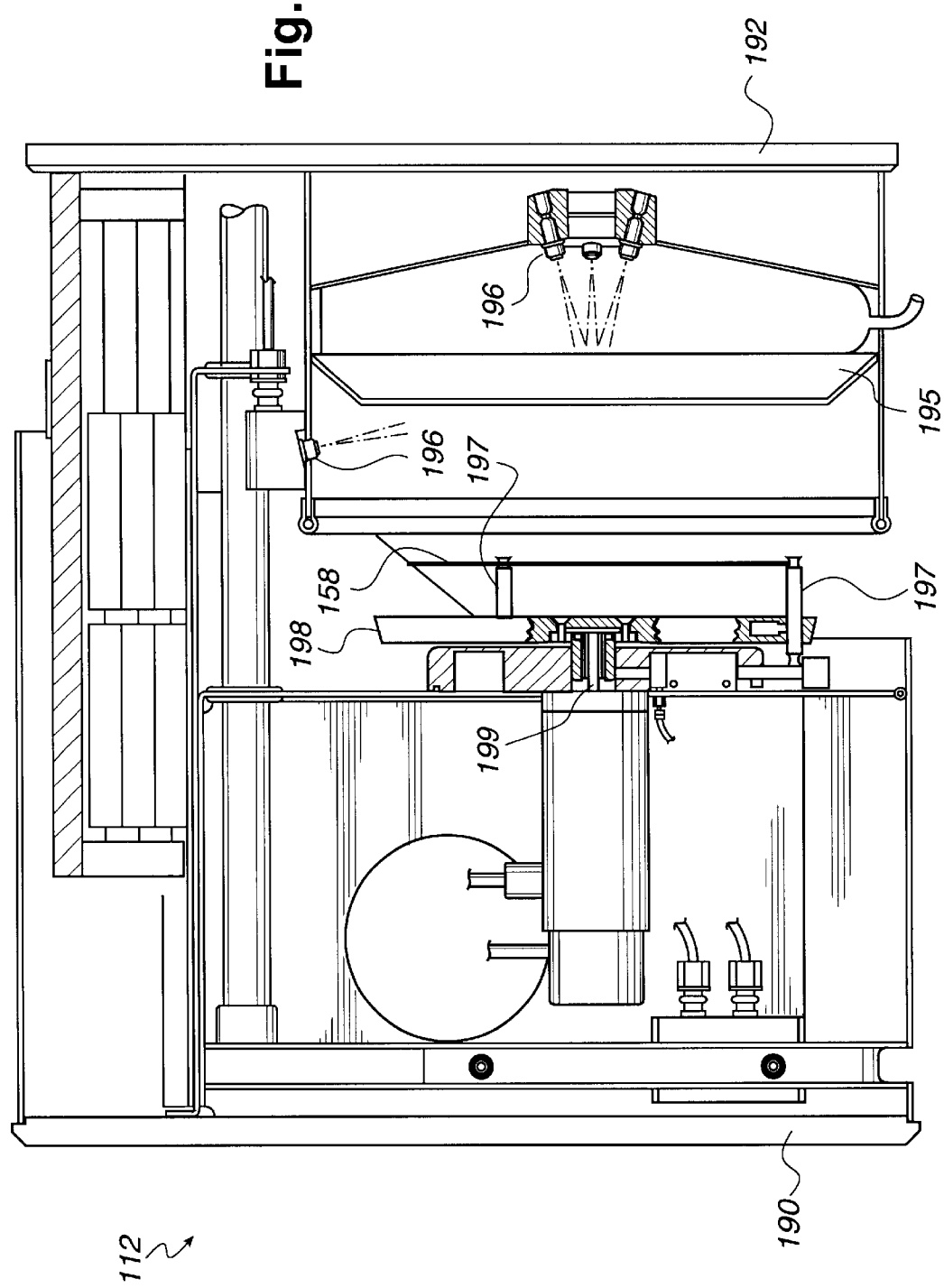

INTEGRATED PLANARIZATION AND CLEAN WAFER PROCESSING SYSTEM

CROSS REFERENCE TO RELATED APPLICATIONS

This application is related to U.S. patent application Ser. No. 09/493,978, filed Jan. 28, 2000, entitled "System and Method for Controlled Polishing and Planarization of Semiconductor Wafers" assigned to the same assignee as the instant application, and such related application is hereby incorporated by reference.

BACKGROUND OF THE INVENTION

1. Field of the Invention

The present invention relates generally to the fabrication of structures on semiconductor wafers, and more specifically to methods and apparatus of chemical mechanical planarization and associated processes.

2. Description of the Related Art

In the fabrication of semiconductor devices, integrated circuits are defined on semiconductor wafers by forming a plurality of layers over one another resulting in multilevel structures. As a result of the various layers disposed over one another, a surface topography of the wafer can become irregular, and an uncorrected irregularity increases with subsequent layers. Chemical Mechanical Planarization (CMP) has developed as a fabrication process utilized to planarize the surface of a semiconductor wafer, as well as to perform additional fabrication processes including polishing, buffing, substrate cleaning, etching processes, and the like.

At the substrate level, transistor devices having diffusion regions are formed over and into silicon substrates. In subsequent levels, interconnect metallization lines are patterned and electrically connected to the transistor devices to define a desired functional device. As is well known, patterned conductive layers are insulated from other conductive layers by dielectric materials, such as silicon dioxide. At each metallization level there is a need to planarize metal or associated dielectric material. Without planarization, fabrication of additional metallization layers becomes substantially more difficult due to the higher variations in the surface topography. In other applications, metallization line patterns are formed in the dielectric material, and then metal CMP operations are performed to remove excess metallization, e.g., such as copper.

The planarization of copper metallization line patterns presents particular challenges in semiconductor wafer manufacture. Metal CMP operations are typically utilized to remove excess copper, or other metal, deposited over a substrate having features formed therein. The excess copper is removed from the surface of the substrate leaving only the features filled with copper. The differing types of materials, densities of materials, and the like at the surface of the substrate, respond to CMP differently, and can result in varying removal rates and overpolishing. In the fabrication of copper dual damascene structures, non-uniform and variable materials require precision CMP with maximum control of the process and without overpolish.

Methods and processes used in the fabrication of, by way of example, copper dual damascene and LowK dielectric structures are evolving over prior art, but CMP processes remain integral to the fabrication process. What is needed are apparatus and methods to consolidate and integrate the most technologically advanced CMP process operations with closely related substrate cleaning and drying operations. The apparatus and methods should be implemented in such a manner as to maintain efficient and economical manufacturing practices and facilities, and high through-put of processed semiconductor wafers.

SUMMARY OF THE INVENTION

Broadly speaking, the present invention fills these needs by providing an integrated processing system that integrates CMP, scrubbing and cleaning, and spin-rinse-dry operations in a single cluster tool environment. The present invention can be implemented in numerous ways, including as a process, an apparatus, a system, a device, and a method. Several embodiments of the present invention are described below.

In one embodiment, a wafer processing module is disclosed. The wafer processing module includes a pad magazine for holding CMP pads. A pad spindle having a pad carrier is provided and configured to connect to one of the CMP pads. Also provided is a pad exchange robot for accessing CMP pads in the pad magazine, and positioning CMP pads for connecting to the pad carrier. A wafer carrier on a wafer spindle is configured to hold a wafer to be processed, and the pad carrier is partially positioned over the wafer carrier for sub-aperture processing of the wafer.

In another embodiment, a dual wafer processing module is disclosed. The dual wafer processing module includes a pair of pad magazines for holding CMP pads. A first wafer carrier for holding wafers to be processed is configured to a first wafer spindle, and the first wafer spindle and carrier are aligned with one of the pair of pad magazines. A second wafer carrier for holding wafers to be processed is configured to a second wafer spindle, and the second wafer carrier and spindle are aligned with another one of the pair of pad magazines. The dual wafer processing module further includes a first pad spindle with a first pad carrier to which one of the CMP pads is connected, and a second pad spindle with a second pad carrier to which one of the CMP pads is connected. A pad exchange robot for accessing CMP pads held in the pair of pad magazines is also included. The pad exchange robot further positions CMP pads for connecting to the first and second pad carriers. The first pad carrier and the second pad carrier are each configured to partially apply respective CMP pads over each of the first and second wafer carriers.

In still a further embodiment, a system for processing wafers is disclosed. The system for processing wafers includes a module frame for integrating a wafer planarization unit, a wafer scrubbing unit; and an SRD unit. The integrated wafer planarization unit includes a pad magazine for holding CMP pads, and a pad spindle with a pad carrier configured to connect to one of the CMP pads. A pad exchange robot for accessing CMP pads held in the pad magazine is included which positions one of the CMP pads for connection to the pad carrier. Also included is a wafer spindle with a wafer carrier for holding a wafer to be processed. The pad carrier is capable of being partially positioned over the wafer carrier for sub-aperture processing of the wafer.

In yet another embodiment, a wafer preparation system is disclosed. The wafer preparation system includes at least one base unit that supports a sub-aperture CMP preparation system. The sub-aperture CMP preparation system is housed in and supported by the base unit. Also included is a pad exchange system to exchange CMP processing pads used in the sub-aperture CMP preparation system. The pad exchange system includes a pad exchange robot to remove CMP processing pads from, and to attach CMP processing pads to the sub-aperture CMP preparation system. The pad exchange system also obtains CMP processing pads from, and deliver CMP processing pads to a pad magazine. The pad exchange robot is attached to the base unit. The pad exchange system includes at least one pad magazine that is configured to hold a plurality of CMP processing pads for use in the sub-aperture CMP processing system. The pad magazine is attached to the base unit.

The advantages of the present invention are numerous. One notable benefit and advantage of the invention is the consolidation and integration of related fabrication processes into a single integrated system. In the fabrication of certain semiconductor structures such as LowK dielectrics and copper dual damascene structures, repeated processing through the processes of CMP, wafer cleaning, and SRD is typically required. The present invention integrates the most technologically advanced of these processing tools for precision processing, high through-put, and economy of floor space and facility support requirements.

Another benefit is the integrated pad exchange system. By implementing a pad exchange robot and pad magazine, one embodiment of the present invention maintains a constant supply and exchange of processing surfaces to maintain steady-state and consistent processing with higher operational time for integrated processing systems by eliminating the requirement for system shut-down to change pads.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIG. 5C shows SRD processing tool of FIG. 5B in an open configuration in accordance with an embodiment of the invention.

DETAILED DESCRIPTION OF THE PREFERRED EMBODIMENTS

An invention for a cluster tool implementing the most technologically advanced precision semiconductor fabrication modules for planarization and cleaning of wafers in a manufacturing efficient and economical system is disclosed. In preferred embodiments, a sub-aperture CMP cluster tool includes a processing system implementing a sub-aperture CMP processing module, a brush box processing module, a spin-rinse-dry (SRD) processing module, and associated wafer handling and transfer apparatus and control modules within an integrated system. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

A sub-aperture CMP configuration is herein defined as a configuration, wherein the contact surface of a polishing pad with the wafer can at certain points in time be smaller than the surface area of the wafer. Generally, sub-aperture CMP processing tools are therefore defined as those CMP systems in which the surface area of the polishing pad in contact with the wafer is smaller than the surface area of the wafer being polished. In the instant application, references to CMP tools and systems of the present invention are references to sub-aperture CMP configurations.

Figure 1:
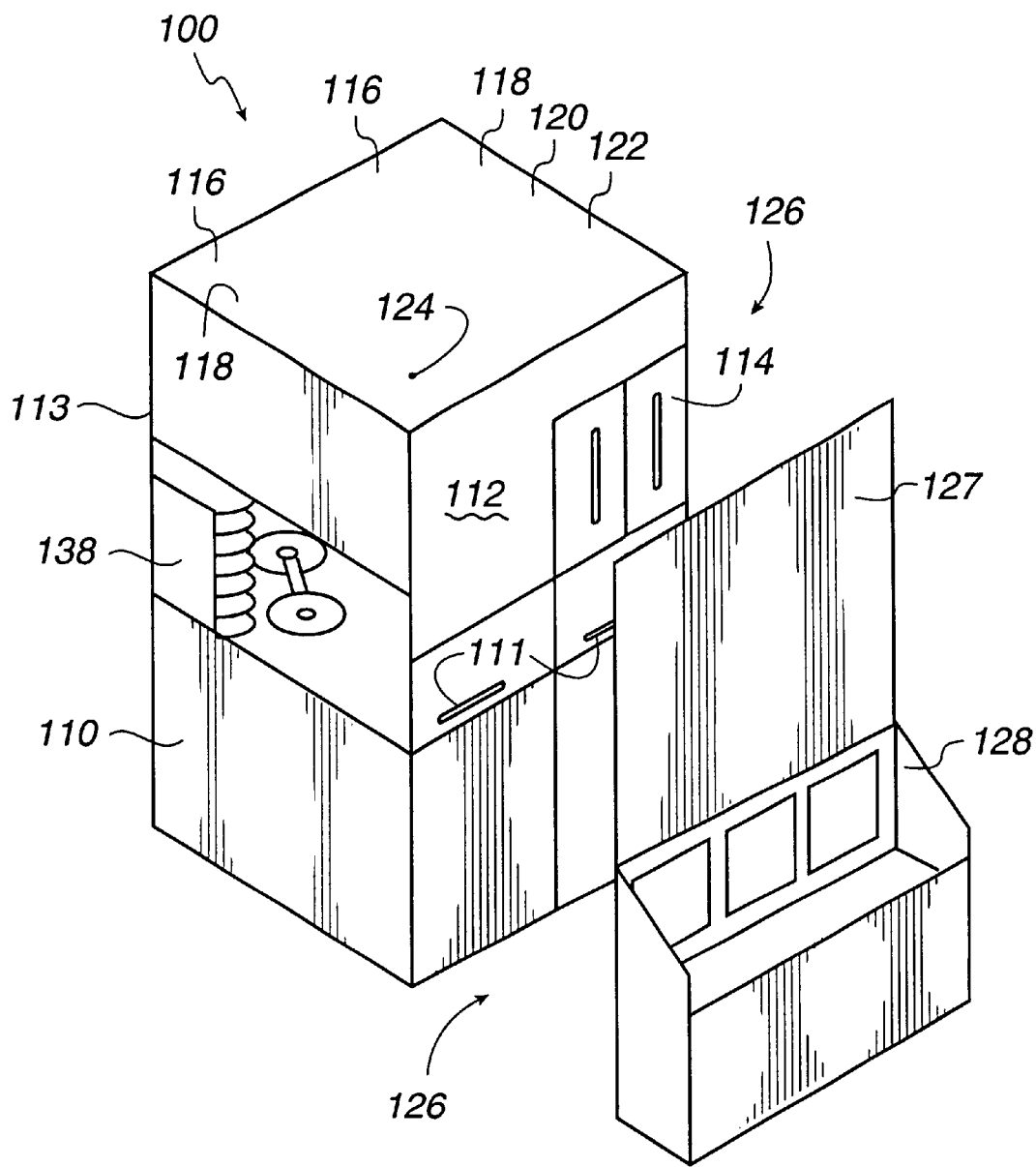
FIG. 1 shows an cluster tool integrated processing system, in accordance with one embodiment of the present invention.

FIG. 1 shows an cluster tool integrated processing system 100, hereinafter referred to as cluster tool 100, in accordance with one embodiment of the present invention. In the illustrated embodiment, the cluster tool 100 is configured as a dual process unit integrating two processing modules of the integrated tools as is described in greater detail below. Cluster tool 100 includes two processing modules 110, two brush box scrubber units 114, two SRD processing tools 112, and associated system control, wafer transfer and handling, and support apparatus.

In FIG. 1, processing module 110 is configured to house and support a subaperture CMP processing tool as will be described in greater detail below in reference to FIGS. 2A and 2B. In the illustrated embodiment, processing module 110 is configured as a base unit upon, in, and over which integrated processing tools are arranged into the processing system of cluster tool 100. System control 116 is provided for each of the processing modules 110, and is configured for control of CMP processing systems within processing modules 110. Each processing module 110 is configured with an AC power and distribution box 118, and a system control box 120 is provided for integration and overall control of the cluster tool 100. Brush box control 122 and SRD control 124 are provided for each of the brush box scrubber units 114 and SRD processing units 112, respectively.

An interface assembly 127 is shown in the illustrated embodiment at a front end of the cluster tool 100. For ease of description, the interface assembly 127 is shown as separated from the processing modules 110. It should be understood, however, that interface assembly 127, in one embodiment, is part of the overall integrated system of cluster tool 100. In one embodiment, interface assembly 127 is configured as a supporting structure of cluster tool 100 to provide an area for input/output 128 for wafers to be introduced into and removed from cluster tool 100, and to provide for user interface for cluster tool 100 operation. In one embodiment, input/output 128 is configurable to integrate one or more wafer transfer pods or stations for cassettes of wafers to be transferred to or from cluster tool 100.

Between interface assembly 127 and processing modules 110 is wafer transfer and handling apparatus 126. The wafer transfer handling and apparatus 126 is not illustrated in FIG. 1 and, for ease of description, only the space into which the wafer transfer and handling apparatus would be located is shown. In one embodiment, wafer transfer and handling apparatus 126 includes one or more robots for transferring wafers from input/output 128 to processing modules 110, as well as from processing modules 110 to input/output 128. Additionally, wafer transfer and handling apparatus 126 is configured to transfer wafers between the processing tools of cluster tool 100. By way of example, wafer transfer and handling apparatus 126 transfers a wafer from input/output 128 to processing module 110 through a CMP input/output 111, and the wafer is processed through a CMP operation. Following CMP, the wafer transfer and handling apparatus 126 receives the wafer from the CMP input/output 111 and then transfers the wafer to brush box scrubber unit 114 where the wafer is processed through a post-CMP clean. The wafer transfer and handling apparatus 126 then transfers the wafer from the brush box scrubber unit 114 to an SRD processing tool 112 where the wafer is processed through a spin, rinse, and dry. The wafer transfer and handling apparatus 126 then receives the processed wafer from the SRD processing tool 112 and transfers the wafer to input/output 128. In one embodiment, wafer transfer and handling apparatus 126 includes at least one robot for transferring wafers. In another embodiment, the robot includes a "wet" wafer handling arm and a "dry" wafer handling arm for the handling of wafers prior to and after processing through SRD 112. In a further embodiment, the wafer transfer and handling apparatus 126 includes a plurality of robots designated for operation by station, module, or process as desired.

In one embodiment, Cluster tool 100 is configured as a fully contained and controllable environment. An enclosed structure is maintained from the front of interface assembly 127 through the rear of processing modules 110. Processing modules 110 include a module frame 113 to support the integrated planarization and cleaning tools, and associated support and control systems. Input/output 128 allows for insertion and removal of substrates for processing, with the interior environment of the cluster tool being otherwise isolated from the ambient environment. Further, the interior environment of cluster tool 100 can be controlled to set and maintain a desired temperature, pressure, and state of cleanliness.

Figure 2A:
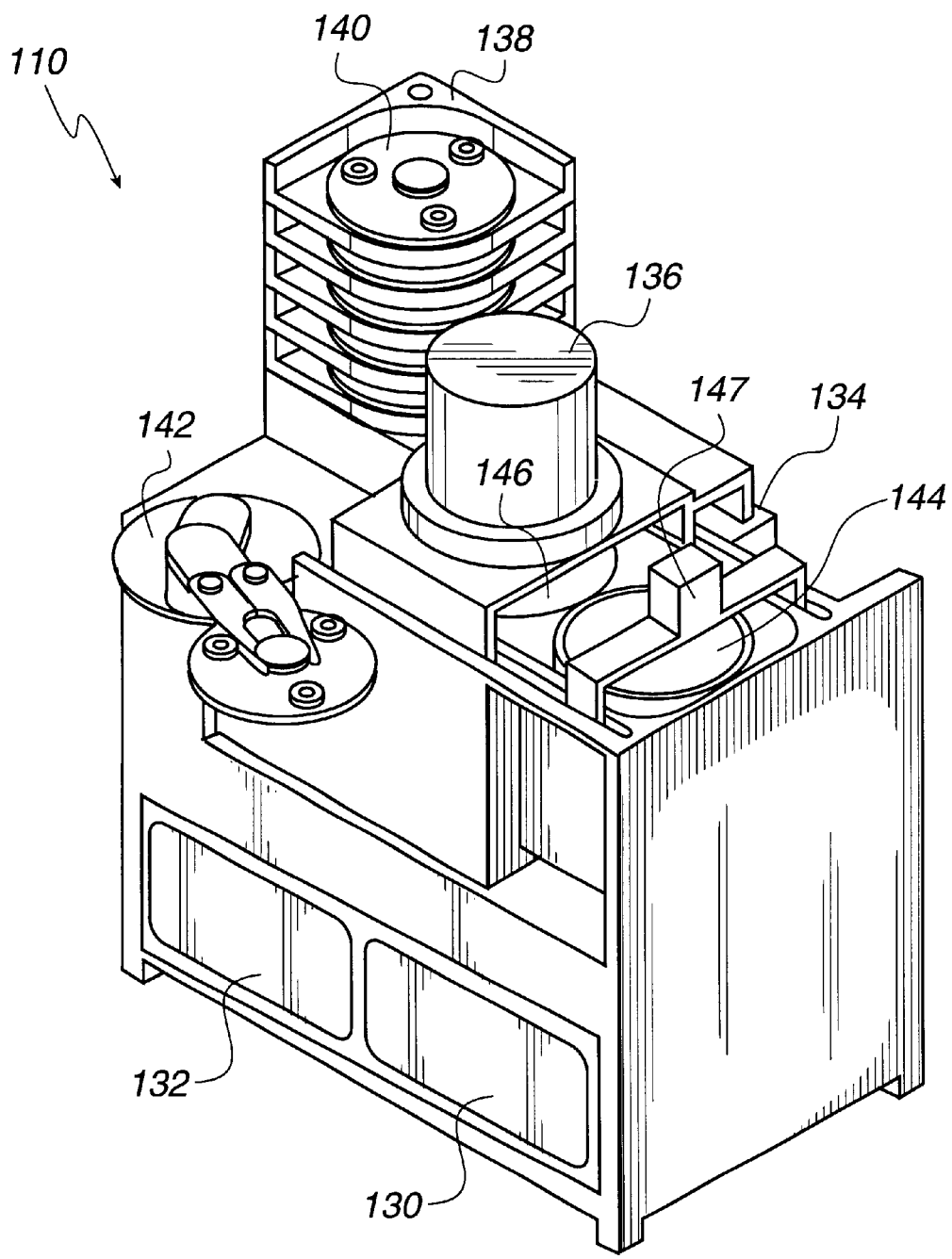
FIG. 2A shows a cut-away view of the bottom section of a single processing module, in accordance with one embodiment of the invention.

FIG. 2A shows a cut-away view of the bottom section of a single processing module 110, in accordance with one embodiment of the invention. In one embodiment, the bottom of each processing module 110 primarily houses the CMP processing tool. The CMP processing tool housed in the illustrated processing module 110 is a sub-aperture CMP processing tool as described in detail in co-pending application Ser. No. 09/493,978, which application is incorporated by reference herein. As illustrated in FIG. 2A, the CMP processing tool in processing module 110 includes a three spindle processing unit. A pad spindle 136 is shown for the support and operation of the wafer polishing pad, a conditioning spindle 146 provides for the support and operation of the conditioning pad, and a wafer spindle 144 provides for the support and operation of the wafer being processed. Although the diameter of the polishing pad is preferably equal to, or substantially the same as, the diameter of the wafer as in the illustrated embodiment, other diameter ratios of the polishing pad and wafer are contemplated. In one embodiment, the polishing pad size may be anywhere in the range of the size of a single die on the wafer to an area twice as large as that of the wafer. Linear actuators 134 provide for movement of the pad spindle across a conditioning pad on the conditioning pad spindle 146 and the wafer on wafer spindle 144. Linear and rotary actuators (not shown) are housed within the processing module 110 for additional movement and operation of each of the spindles 136, 146, 144. In one embodiment, linear and rotary actuators are direct drive, electromagnetic actuators.

In-situ process status control metrology (metrology) 147 is shown for the monitoring and evaluation of CMP. Chemical supply is provided in the bottom of process module 110. In the illustrated embodiment, brush box scrubber unit chemistry supply 130 and CMP chemistry supply 132 are shown. In another embodiment, additional chemical supply is provided for SRD chemistry as desired.

In accordance with one embodiment of the invention, a pad exchange system is incorporated into each processing module 110. In the illustrated embodiment, the pad exchange system includes a pad exchange robot 142, and a pad magazine 138 for housing a plurality of process pads 140. In one embodiment, pad exchange is incorporated into the cluster tool 100 to provide for more efficient processing and higher through-put by increasing system operational time, and providing more consistent and effective pads 140 for consistent, steady state, and controllable wafer processing. In one embodiment, each of the conditioning and polishing pads are continuously monitored for residue build-up, wear, and effective processing. Pad magazine 138 houses a plurality of both conditioning and processing pads 140, and as conditions dictate, or according to a pre-determined cycle, pads 140 are replaced for continuous processing without the need to shut down operation of the processing module 110, or cluster tool 100, to change pads 140 as needed.

In another embodiment, pads 140 exhibiting the highest requirement for change (e.g., polishing pads) are exchanged using the pad exchange system and associated apparatus on a regular cycle, or as conditions dictate, and the pad magazine 138 houses only those types of pads 140 required for exchange to be effected without requiring system shutdown. In an embodiment implementing pad exchange of polishing pads, pad spindle 136 having a pad carrier 150 (see FIG. 3) releases a polishing pad which is obtained by pad exchange robot 142. Pad exchange robot 142 inserts the obtained polishing pad into pad magazine 138 according to a predetermined scheme for dirty and clean pads, and then obtains a clean pad 140. Pad exchange robot 142 then positions clean (or new) pad 140 for pick up and attachment to pad carrier 150 (see FIG. 3) on pad spindle 136.

Figure 2B:
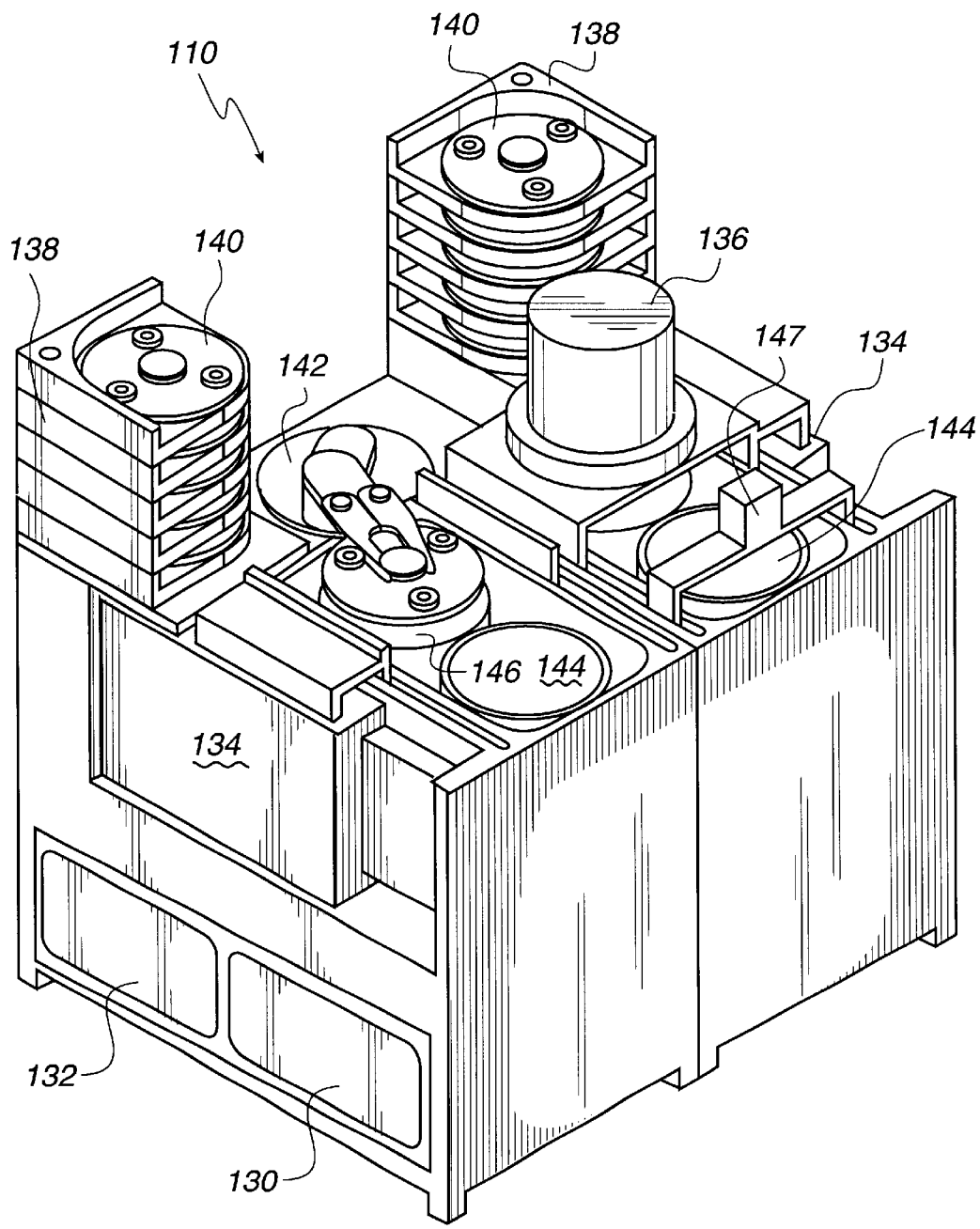
FIG. 2B illustrates a cut-away view of the bottom section of a dual processing module, in accordance with another embodiment of the invention.

FIG. 2B illustrates a cut-away view of the bottom section of a dual processing module 110, in accordance with another embodiment of the invention. In FIG. 2B, two processing modules 110 are shown as incorporated into a single cluster tool 100. In accordance with one embodiment of the invention, processing modules 110 are configured side-by-side, and are mirror images essentially identical to the processing module 110 as described above in reference to FIG. 2A.

In the illustrated embodiment, each processing module 110 contains a three-spindle, sub-aperture CMP processing tool including a pad spindle 136, a conditioning pad spindle 146, and a wafer spindle 144. In one embodiment, each three-spindle, sub-aperture CMP processing tool implements hardware-based multi-axis variable area pressure control for the most precise and controllable CMP processing. Movement of the pad spindle 136 across a conditioning pad on the conditioning pad spindle 146 and the wafer on wafer spindle 144 is provided by linear actuators 134, and additional linear and rotary actuators (not shown) are housed within the processing module 110 for precise movement and control of each of the spindles 136, 146, 144. In one embodiment, linear and rotary actuators are direct drive, electromagnetic actuators. In-situ monitoring and evaluation of CMP is provided for each CMP process tool by metrology 147.

In one embodiment, a pad exchange system is included for the dual process unit having two process modules 110. At least one pad exchange robot 142 is implemented to exchange processing pads 140 which are housed in pad magazine 138. In one embodiment, a pad magazine 138 is configured to each processing module 110.

Chemical supply is provided in the bottom of process module 110. In one embodiment, each process module 110 includes independent chemical supply for the CMP process tool of the process module, and for the associated brush box scrubber unit 114 (see FIG. 1). In another embodiment, additional chemical supply is provided for an associated SRD 112. In a further embodiment, chemical supply is configured as a cluster tool 100 CMP chemistry supply 132 for the dual process unit having two process modules 110, and brush box scrubber unit chemistry supply 130 for the dual process unit having two process modules 110. In another embodiment, additional chemical supply is provided for SRD chemistry as desired.

Cluster tool 100 (see FIG. 1) integrates one or more CMP processing tools in processing modules 110, with one or more brush box scrubber units 114, one or more SRD processing tools 112, and associated system control, wafer transfer and handling, and support apparatus. Several embodiments of the individual processing tools that are integrated into cluster tool 100 will now be described.

Figure 3:
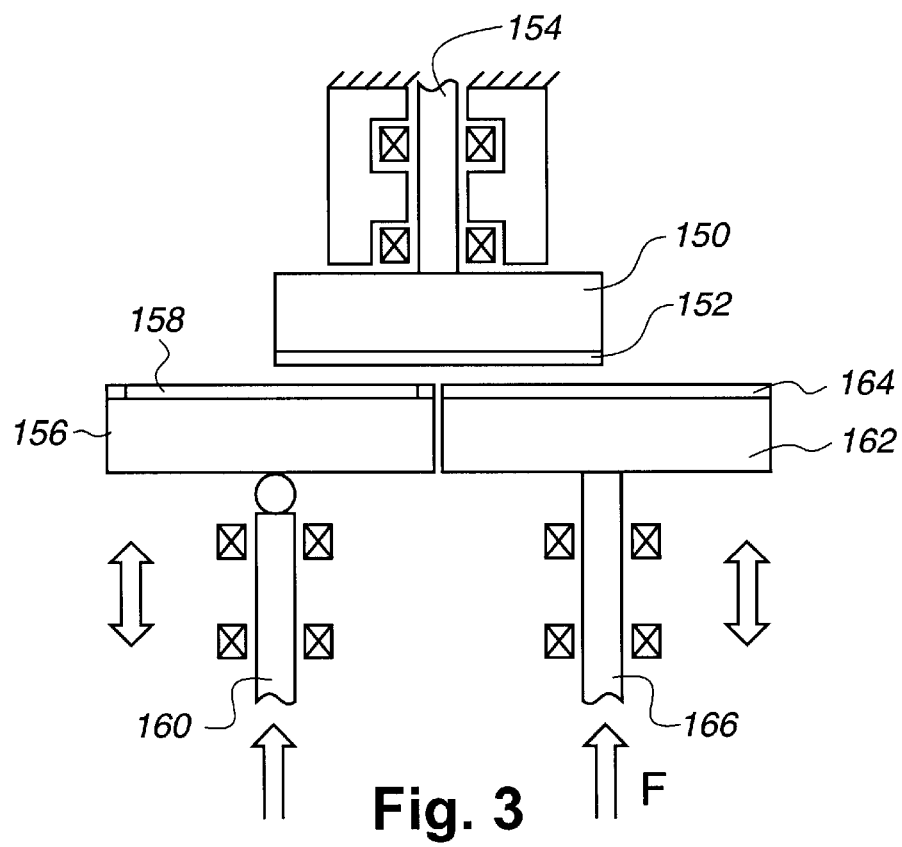
FIG. 3 shows an exemplary processing configuration of a small-footprint, low-consumables-use sub-aperture CMP processing tool, in accordance with an embodiment of the invention.

In one embodiment of the invention, a CMP processing tool is included in a processing module 110. As described above in reference to FIGS. 2A and 2B, the CMP processing tool is a sub-aperture CMP processing system, and is generally a small-footprint, low-consumables-use CMP processing tool. FIG. 3 shows an exemplary processing configuration of a small-footprint, low-consumables-use sub-aperture CMP processing tool, in accordance with an embodiment of the invention. As illustrated in FIG. 3, the three-spindle processing tool includes a pad spindle 154 with a pad carrier 150 to which is attached a polishing pad 152. A wafer spindle 160 having a wafer carrier 156 holds wafer 158. A conditioning pad spindle 166 having a conditioning pad carrier 162 is positioned adjacent to wafer spindle 160 and provides for conditioning of polishing pad 152 with conditioning pad 164. In one embodiment, the illustrated configuration is utilized for CMP processing using direct drive electromagnetic rotary and linear actuators to rotate and position spindles 154, 160, 166, and a hardware based multi-axis variable area pressure controller provides for manipulating forces imparted by individual spindles 154, 160, 166 and carriers 150, 156, 162. As described above, a pad exchange system (not shown) is configured to replace polishing pads 152 and conditioning pads 164 as desired or required to maintain consistent, steady-state and controllable processing.

Figure 4A:
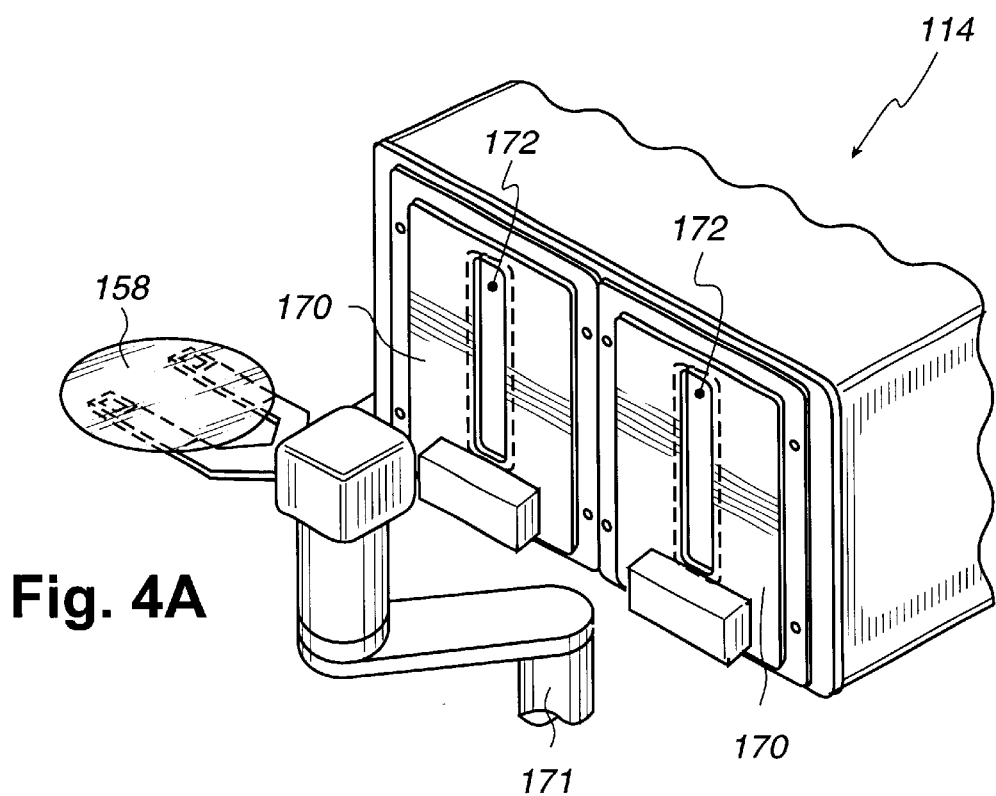
FIG. 4A shows a dual brush box scrubber unit configuration in accordance with one embodiment of the invention.

FIG. 4A shows a dual brush box scrubber unit 114 configuration in accordance with one embodiment of the invention. Two brush box scrubber units 114 are shown positioned side-by-side in accordance with one embodiment, and other embodiments include positioning brush box scrubber units 114 one over the other in a vertical orientation, and single brush box scrubber units 114 configured to each processing module 110 (see FIG. 1). Each brush box scrubber unit 114 is one of a plurality of brush box scrubber unit 114 types that, by way of example, process wafers 158 in a vertical orientation, a horizontal orientation, and implement a plurality of processing surfaces and chemistries. Typically, each brush box scrubber unit 114 includes an access door 170 and a wafer slot 172 through which wafers 158 are inserted into and removed from brush box scrubber unit 114. An embodiment of a wafer transfer and handling robot 171 is illustrated in FIG. 4A utilized for transferring wafers 158 between process tools, including to and from brush box scrubber units 114.

Figure 4B:
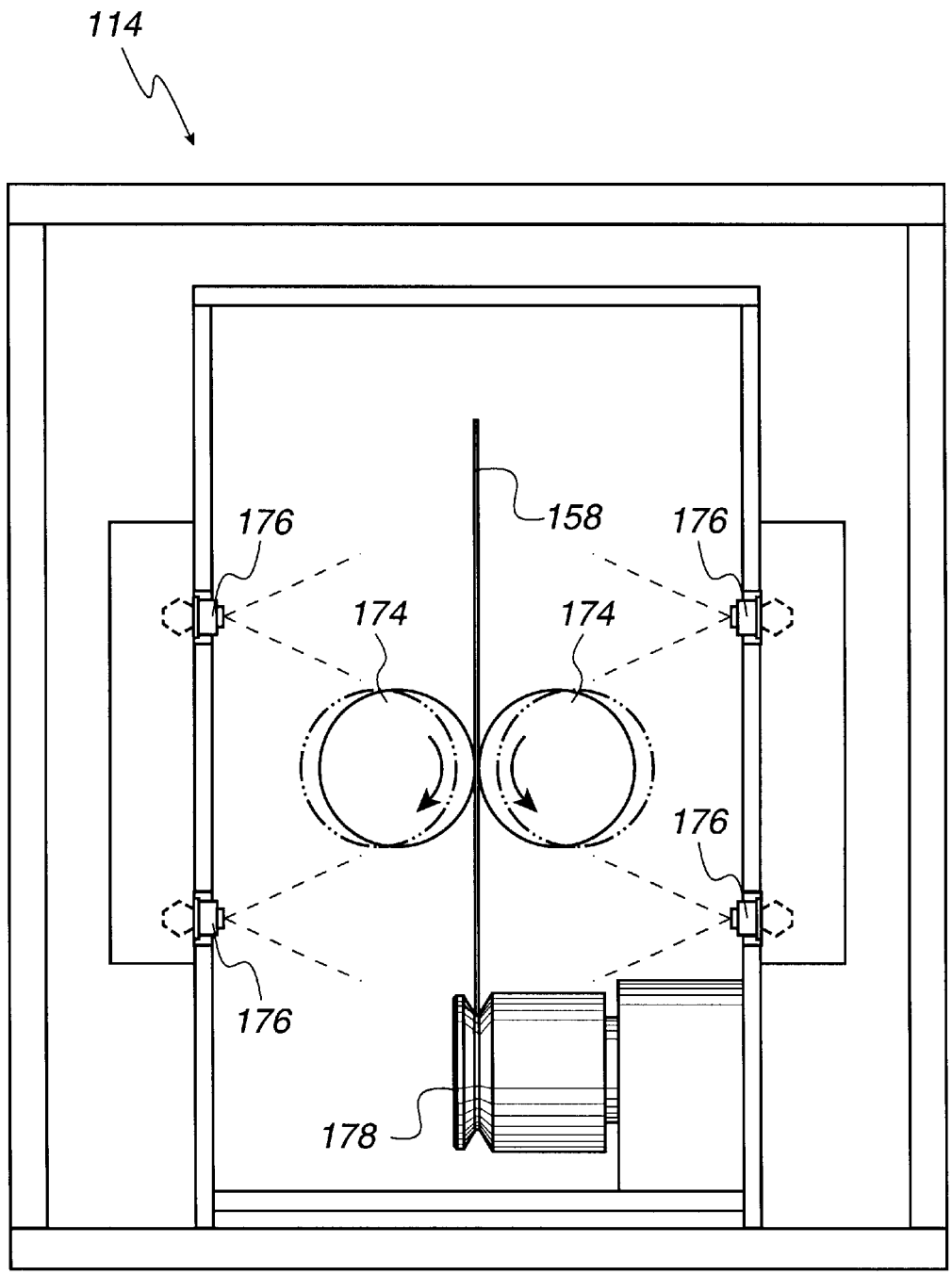
FIG. 4B illustrates a single brush box scrubber unit in accordance with another embodiment of the invention.

FIG. 4B illustrates a single brush box scrubber unit 114 in accordance with another embodiment of the invention. The embodiment illustrated in FIG. 4B includes a vertical orientation brush box scrubber unit 114 implementing a dual brush 174 configuration for applying a single brush 174 to each side of wafer 158 simultaneously. Each brush 174 is configured to rotate and to apply a plurality of process surfaces according to desired process operations. Wafer 158 is supported and rotated by roller 178. Process chemistry, cleaning fluids, deionized water, and the like are introduced by nozzles 176, and supplied by brush box scrubber unit chemistry supply 130 (see FIGS. 2A, 2B).

Figure 4C:
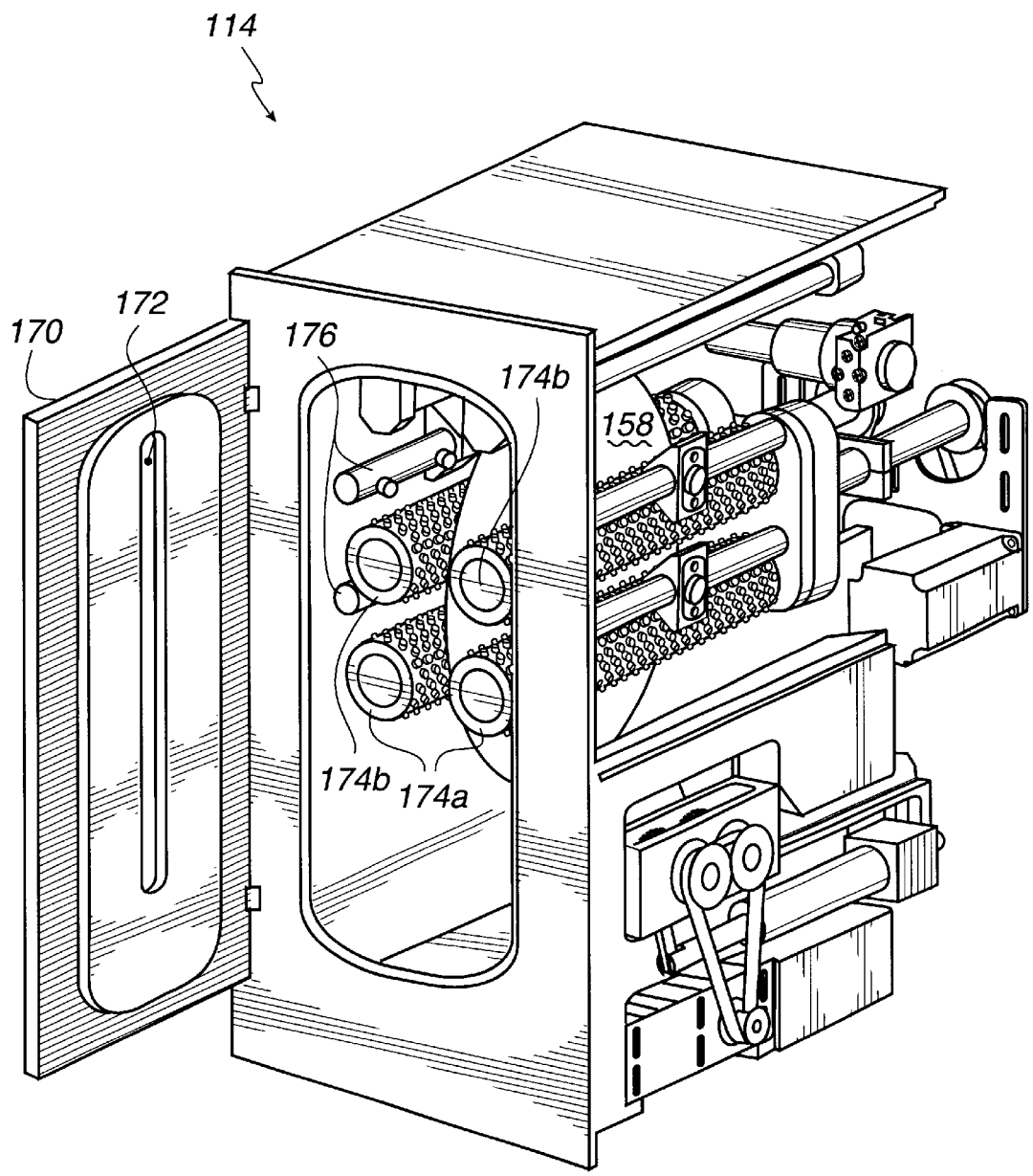
FIG. 4C illustrates a single brush box scrubber unit in accordance with another embodiment of the invention.
Figure 4D:
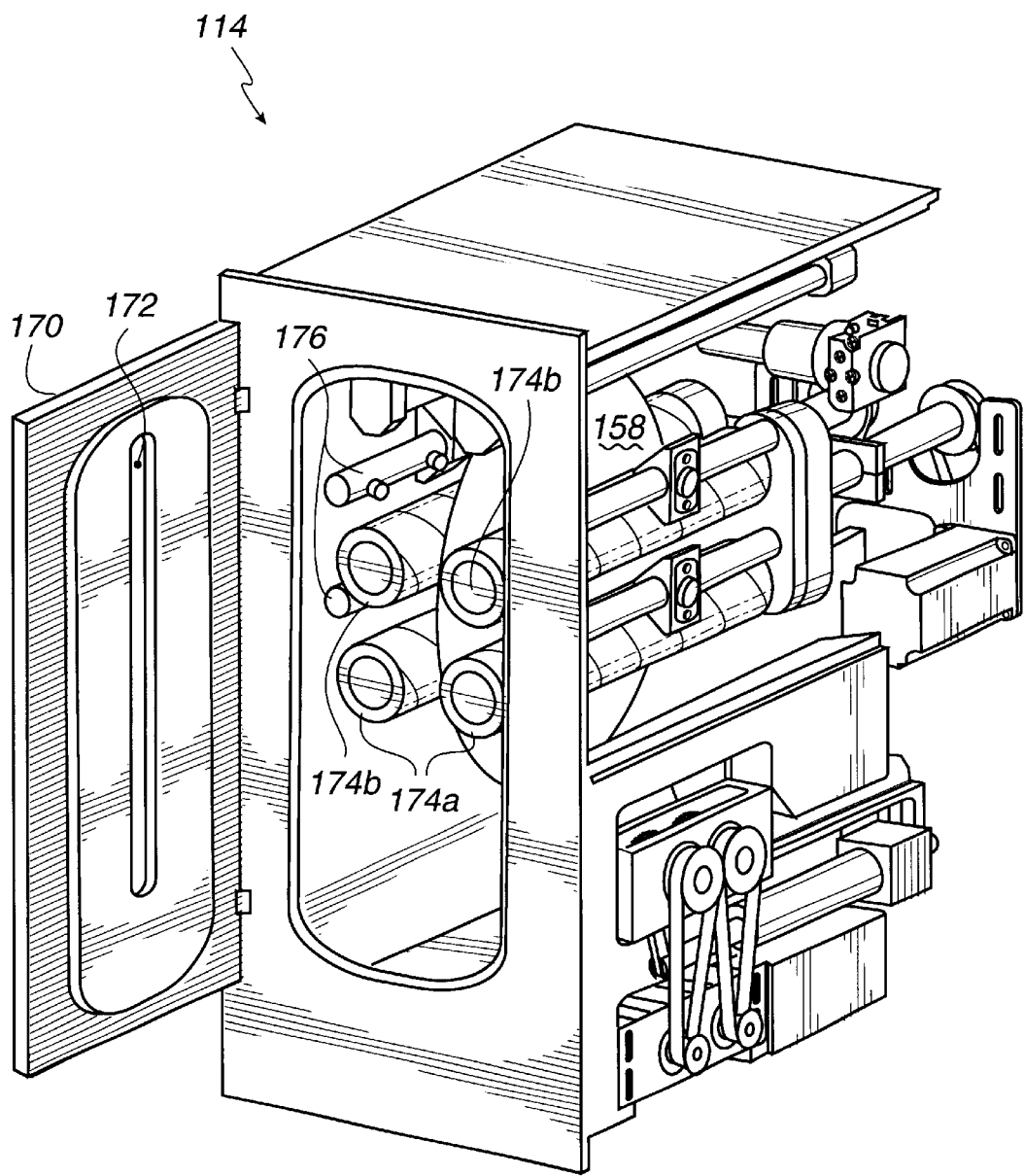
FIG. 4D illustrates the brush box scrubber unit shown in FIG. 4C with an alternative process surface on process brushes, in accordance with another embodiment of the invention.

FIG. 4C illustrates a single brush box scrubber unit 114 in accordance with another embodiment of the invention. FIG. 4C illustrates another embodiment of a vertical brush box scrubber unit 114. Wafer 158 is inserted into and extracted through wafer slot 172 configured in access door 170. In the embodiment illustrated in FIG. 4C, dual process brushes 174a, 174b, are configured to be rotated and applied to each side of wafer 158. Process surfaces of process brushes 174a, 174b, can be varied and combined according to process conditions and desires. Process chemistries, cleaning fluids, deionized water, and the like are introduced into brush box scrubber unit 114 through nozzles 176, and process chemistry, fluids, deionized water, and the like are supplied by brush box scrubber unit chemistry supply 130 (see FIGS. 2A, 2B). FIG. 4D illustrates the brush box scrubber unit 114 shown in FIG. 4C with an alternative process surface on process brushes 174a, 174b, in accordance with another embodiment of the invention.

Figure 5A:
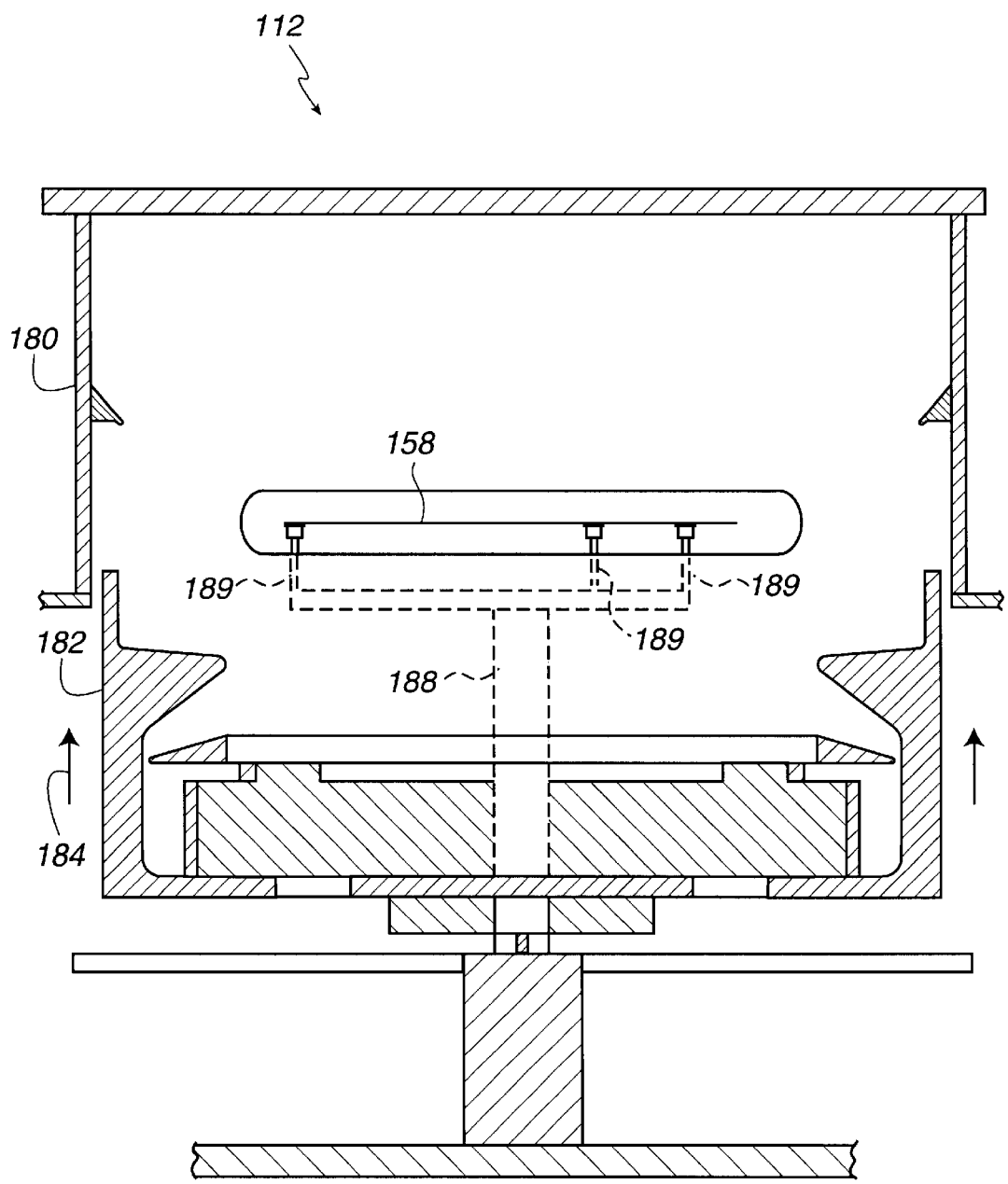
FIG. 5A illustrates a single SRD processing tool in accordance with one embodiment of the present invention.

FIG. 5A illustrates a single SRD processing tool 112 in accordance with one embodiment of the present invention. SRD processing tools 112 are implemented in cluster tool 100 in several embodiments in a plurality of types and configurations. FIGS. 5A–5D are exemplary of a plurality of SRD configurations including vertical and horizontal orientation for wafer processing, open and enclosed units, and oriented in side-by-side horizontal configuration, one over another vertical configuration, or as single units configured to one process module 110 with the other integrated tools.

FIG. 5A illustrates an SRD processing tool 112 configured to process a wafer 158 in a horizontal orientation. The illustrated SRD processing tool 112 is an enclosed unit having an upper bowl 180 and a lower bowl 182 that separate to open the SRD processing tool 112 for inserting or removing a wafer 158. SRD processing occurs with the upper bowl 180 and lower bowl 182 joined and overlapping in a closed position. In one embodiment, lower bowl 182 is fixed in position and upper bowl 182 is raised 184 providing access to insert or remove a wafer 158. Typically, wafer 158 is attached to SRD spindle 188 with wafer pins 189 with the SRD processing tool in the open position. Upper bowl 180 is lowered over lower bowl 182, and SRD spindle 188 positions wafer 158 in lower bowl 182, and rotates wafer at any of a plurality of rotation speeds while the SRD processing tool is in the closed position. Deionized water, or other processing chemistries, are applied (not shown) as desired according to process requirements, and supplied through SRD chemistry or deionized water supply. Wafer 158 is spun dry, and the SRD processing tool 112 transitions to an open position for wafer 158 removal.

Figure 5B:
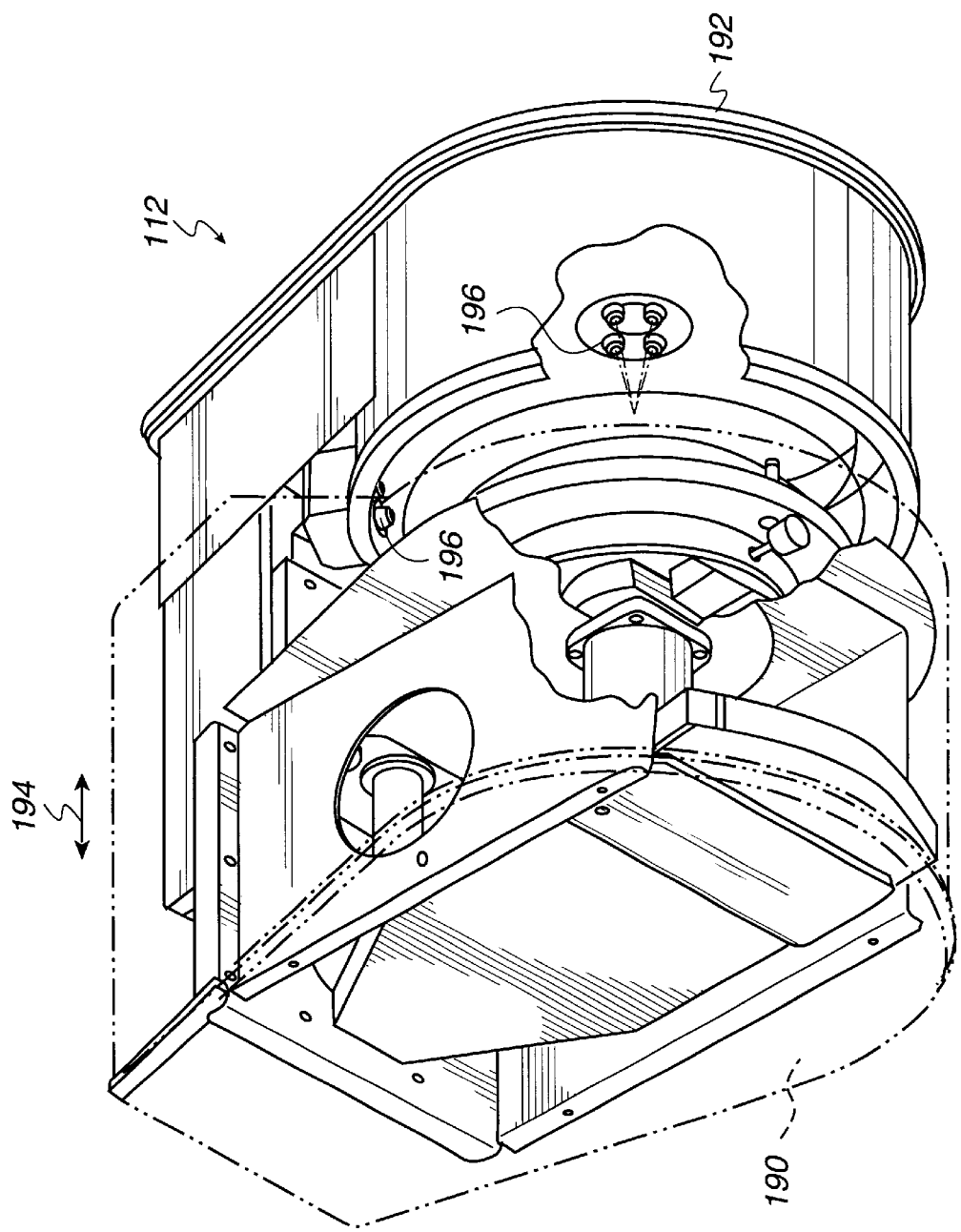
FIG. 5B illustrates an SRD processing tool configured to process a wafer in a vertical orientation in accordance with another embodiment of the invention.

FIG. 5B illustrates an SRD processing tool 112 configured to process a wafer 158 in a vertical orientation in accordance with another embodiment of the invention. In the illustrated embodiment, SRD processing tool 112 includes a left half 190 and a right half 192 which are configured to join and separate 194 to provide for insertion and removal of a wafer 158 for processing. In the separated or open position, a wafer 158 is inserted in a vertical orientation. The SRD processing tool 112 then closes to enable wafer 158 processing.

FIG. 5C shows SRD processing tool 112 of FIG. 5B in an open configuration in accordance with an embodiment of the invention. Wafer 158 is inserted into the SRD processing tool 112 and attached with wafer pins 197 to wafer carrier 198 attached to SRD wafer spindle 199 configured to rotate wafer at a plurality of wafer rotation speeds. When the SRD processing tool 112 containing a wafer 158 to be processed is transitioned to the closed position, wafer 158 is inserted into annular chamber 195 where wafer 158 is spun at a desired rotation speed, and SRD process chemistries, cleaning fluids, or deionized water are introduced to both active and back sides of wafer 158 through nozzles 196. SRD process chemistries, cleaning fluids, deionized water, and the like are supplied through SRD fluid supply (not shown). At the completion of processing, SRD processing tool 112 transitions to an open position for wafer removal. As with the embodiment of SRD processing tool 112 illustrated in FIG. 5A, the embodiment illustrated in FIGS. 5B and 5C can be position side-by-side in a dual processing unit, one over the other in a vertical orientation dual processing unit, or as a single unit integrated with other processing tools in cluster tool 100 (see FIG. 1).

Figure 5D:
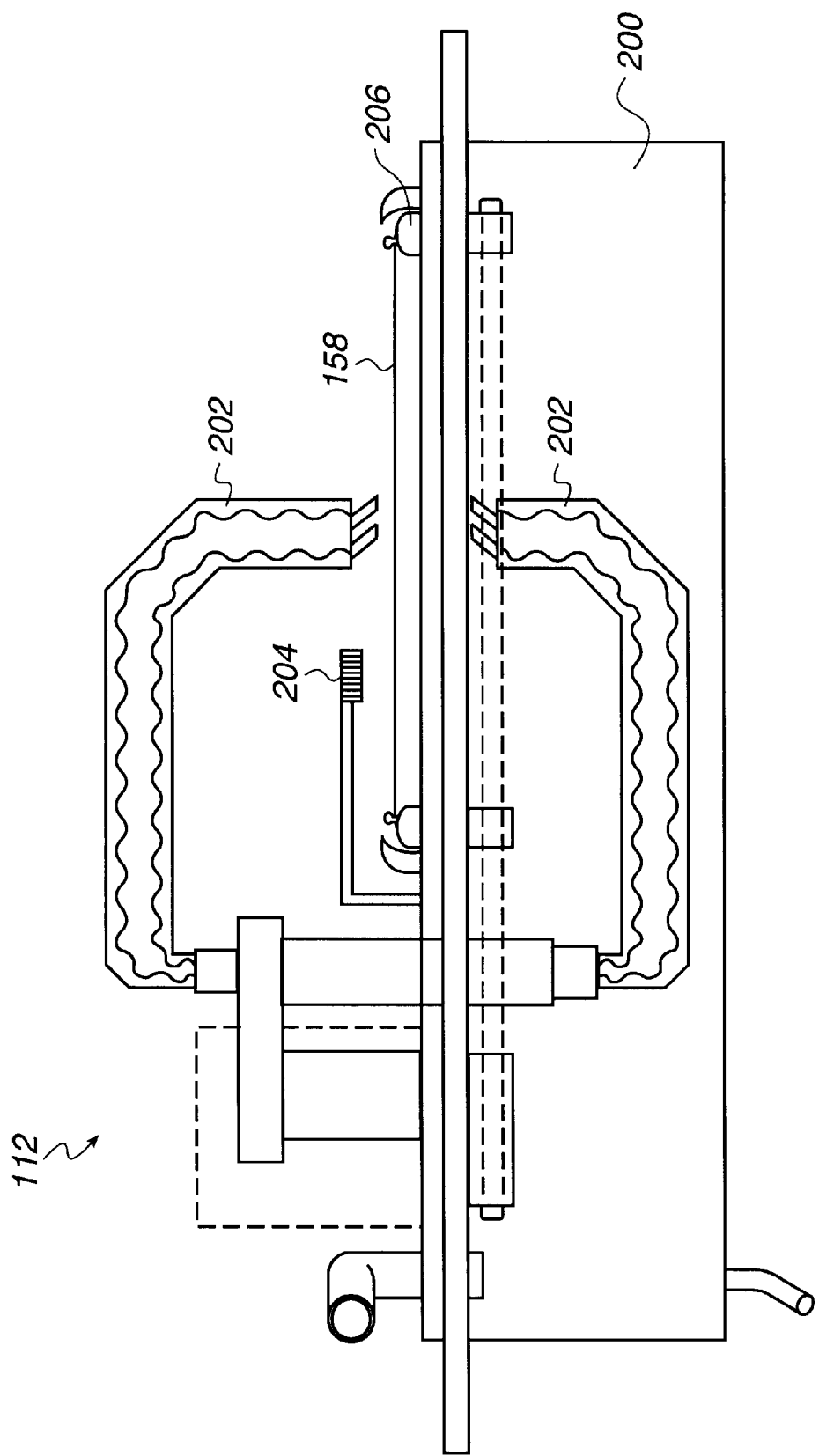
FIG. 5D is an illustration of a substrate rinsing and drying processing tool 112 implementing a surface tension reducing process that is integrated into the cluster tool in accordance with another embodiment of the invention.

FIG. 5D is an illustration of a substrate rinsing and drying processing tool 112 implementing a surface tension reducing process that is integrated into cluster tool 100 in accordance with another embodiment of the invention. The substrate rinsing and drying processing tool 112 implementing a surface tension reducing process is a variation of a traditional SRD processing tool 112, and is described as an embodiment of the SRD processing tool 112 of the present invention. Substrate rinsing and drying tool 112 implementing a surface tension reducing process is essentially an open SRD, in one embodiment. Wafer 158 is affixed to wafer spindle 206, providing ready access to both active and back sides of wafer 158. Wafer spindle 206 is configured to rotate wafer at a plurality of wafer rotation speeds according to process desires. Processing chemistry, cleaning fluids, deionized water, drying agents, and the like are provided to both sides of rotating wafer through fluid supply 202 which, in one embodiment, is configured to supply at least two different fluids simultaneously, and to transition from a center region of rotating wafer 158 to an outer region of rotating wafer 158 while dispensing the two different fluids. Excess fluid and other by-products of processing collect in tray 200. In one embodiment, surface tension reducing SRD processing is monitored and controlled with process metrology 204. Process chemistry, cleaning fluids, drying agents, deionized water, and the like are supplied through SRD fluid supply (not shown). Similar to other embodiments of SRD processing tools 112, substrate rinsing and drying processing tool 112 implementing a surface tension reducing process can be configured as a single unit with the other integrated tools of a process module 110, as well as in a dual processing configuration with two substrate rinsing and drying tools 112 implementing a surface tension reducing process configured side-by-side, or one over the other.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A wafer processing module, comprising:
   a pad magazine for holding chemical mechanical planarization (CMP) pads;
   a pad spindle having a pad carrier configured to connect to one of the CMP pads;
   a pad exchange robot for accessing CMP pads held in the pad magazine and positioning one of the CMP pads for connection to the pad carrier; and
   a wafer carrier configured to a wafer spindle for holding a wafer to be processed, the pad carrier capable of being partially positioned over the wafer carrier for sub-aperture processing of the wafer,
   wherein a diameter of the pad carrier and the one of the CMP pads configured to be connected thereto is at least substantially the same as a diameter of the wafer to be processed.

2. The wafer processing module as recited in claim 1, further comprising:
   a conditioning spindle having a conditioning pad carrier configured for holding a conditioning pad, the conditioning pad carrier being positioned adjacent to the wafer carrier; and
   a plurality of direct drive electromagnetic rotary and linear actuators configured to rotate and position the pad carrier, the conditioning pad carrier, and the wafer carrier.

3. The wafer processing module as recited in claim 2, wherein the pad carrier having one of the CMP pads, the conditioning pad carrier having one of the CMP pads, and the wafer carrier holding the wafer to be processed are configured to impart multi-axis variable area pressure for sub-aperture processing of the wafer.

4. The wafer processing module as recited in claim 2, further comprising:
   a processing module frame configured to integrate wafer processing tools with the wafer processing module including,
      a brush box scrubber processing tool; and
      a spin-rinse-dry (SRD) processing tool;
   wherein the processing module frame is configured around and over the wafer processing module, and wherein the brush box scrubber processing tool and the SRD processing tool are positioned within the processing module frame.

5. The wafer processing module as recited in claim 4, wherein the SRD processing tool includes one of a vertical orientation SRD and a horizontal orientation SRD.

6. The wafer processing module as recited in claim 4, wherein the SRD processing tool implements a surface tension reducing process.

7. A dual wafer processing module, comprising:
a pair of pad magazines for holding chemical mechanical planarization (CMP) pads;
a first wafer carrier for holding wafers to be processed, the first wafer carrier being configured to a first wafer spindle and being aligned with one of the pair of pad magazines;
a second wafer carrier for holding wafers to be processed, the second wafer carrier being configured to a second wafer spindle and being aligned with another one of the pair of pad magazines;
a first pad spindle having a first pad carrier being configured to connect to one of the CMP pads;
a second pad spindle having a second pad carrier being configured to connect to one of the CMP pads; and
a pad exchange robot for accessing CMP pads held in the pair of pad magazines and positioning CMP pads for connection to the first pad carrier and for connection to the second pad carrier;
wherein the first pad carrier and the second pad carrier are each configured to partially apply respective CMP pads over each of the first and second wafer carriers, a diameter of each of the first pad carrier and the second pad carrier and each respective CMP pad is at least substantially equal to a diameter of the wafers to be processed.

8. The dual wafer processing module as recited in claim 7, further comprising:
a first conditioning spindle having a first conditioning pad carrier configured for holding a first conditioning pad, the first conditioning pad carrier being positioned adjacent to the first wafer carrier;
a second conditioning spindle having a second conditioning pad carrier configured for holding a second conditioning pad, the second conditioning pad carrier being positioned adjacent to the second wafer carrier; and
a plurality of direct drive electromagnetic rotary and linear actuators configured to rotate and position the first and second pad carrier, the first and second conditioning pad carrier, and the first and second wafer carrier.

9. The dual wafer processing module as recited in claim 8, wherein the first pad carrier having one of the CMP pads, the first conditioning pad carrier having the first conditioning pad, and the first wafer carrier holding one of the wafers to be processed are configured to impart multi-axis variable area pressure for sub-aperture processing of the wafers to be processed, and wherein the second pad carrier having one of the CMP pads, the second conditioning pad carrier having the second conditioning pad, and the second wafer carrier holding one of the wafers to be processed are configured to impart multi-axis variable area pressure for sub-aperture processing of the wafers to be processed.

10. The dual wafer processing module as recited in claim 8, further comprising:
a processing module frame configured to integrate wafer processing tools with the dual wafer processing module including,
at least one brush box scrubber processing tool; and
at least one spin-rinse-dry (SRD) processing tool;
wherein the processing module frame is configured around and over the dual wafer processing module, and wherein the at least one brush box scrubber processing tool and the at least one SRD processing tool are positioned within the processing module frame.

11. The wafer processing module as recited in claim 10, further comprising two brush box scrubber processing tools.

12. The wafer processing module as recited in claim 10, further comprising two SRD processing tools.

13. A system for processing wafers, comprising:
a module frame for integrating a wafer planarization unit, a wafer scrubbing unit, and a spin-rinse-dry (SRD) unit having at least one SRD processing tool implementing a surface tension reducing process, the integrated wafer planarization unit including,
a pad magazine for holding chemical mechanical planarization (CMP) pads;
a pad spindle having a pad carrier configured to connect to one of the CMP pads;
a pad exchange robot for accessing CMP pads held in the pad magazine and positioning one of the CMP pads for connection to the pad carrier; and
a wafer spindle having a wafer carrier for holding a wafer to be processed, the pad carrier capable of being partially positioned over the wafer carrier for sub-aperture processing of the wafer.

14. The system for processing wafers as recited in claim 13, wherein the wafer planarization unit is configured in a wafer processing module, the wafer processing module including,
the pad magazine for holding chemical mechanical planarization (CMP) pads;
the pad spindle having the pad carrier configured to connect to one of the CMP pads;
the pad exchange robot for accessing CMP pads held in the pad magazine and positioning one of the CMP pads for connection to the pad carrier; and
the wafer spindle having the wafer carrier for holding a wafer to be processed, the pad carrier capable of being partially positioned over the wafer carrier for sub-aperture processing of the wafer.

15. The system for processing wafers as recited in claim 14, further comprising two wafer processing modules configured as a dual processing unit within the module frame.

16. The system for processing wafers as recited in claim 15, wherein the wafer scrubbing unit includes two brush box scrubber processing tools, and wherein the SRD unit includes two SRD processing tools.

17. The system for processing wafers as recited in claim 16, wherein each of the two brush box scrubber processing tools is configured to clean wafers with dual processing surfaces applied to each of an active side and a back side of wafers simultaneously, the wafers being in a vertical orientation.

18. The system for processing wafers as recited in claim 16, wherein each of the two SRD processing tools implements a surface tension reducing process.

19. A wafer preparation system, comprising:
at least one base unit configured to support a sub-aperture chemical mechanical planarization (CMP) preparation system, the sub-aperture CMP preparation system being housed in and supported by the at least one base unit; and
a pad exchange system configured to exchange CMP processing pads used in the sub-aperture CMP preparation system, the pad exchange system including,
a pad exchange robot configured to remove CMP processing pads from and to attach CMP processing pads to the sub-aperture CMP preparation system, and further configured to obtain CMP processing pads from and deliver CMP processing pads to a pad magazine, the pad exchange robot being attached to the base unit; and at least one pad magazine configured to hold a plurality of CMP processing pads for use in the sub-aperture CMP processing system, the at least one pad magazine being attached to the base unit, wherein a diameter of the processing pads of the sub-aperture CMP preparation system is at least substantially equal to a diameter of a wafer to be processed.

20. The wafer preparation system as recited in claim 19, further comprising:

a module frame for integrating the base unit, with a wafer scrubbing unit; and a spin-rinse-dry (SRD) unit.

21. The wafer preparation system as recited in claim 19, further comprising a module frame for integrating two base units with a wafer scrubbing unit; and a spin-rinse-dry (SRD) unit, and wherein the pad exchange system includes two pad magazines.

22. The wafer preparation system as recited in claim 21, wherein the wafer scrubbing unit includes two brush box scrubber processing tools, and wherein the SRD unit includes two SRD processing tools.

* * * * *